(12) United States Patent
Liu

(10) Patent No.: US 9,598,771 B2
(45) Date of Patent: Mar. 21, 2017

(54) DIELECTRIC FILM DEFECT REDUCTION

(75) Inventor: Ji-Feng Liu, New Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 287 days.

(21) Appl. No.: 13/221,336

(22) Filed: Aug. 30, 2011

(65) Prior Publication Data

US 2013/0052365 A1    Feb. 28, 2013

(51) Int. Cl.
| | |
|---|---|
| C23C 14/14 | (2006.01) |
| C23C 16/509 | (2006.01) |
| C23C 16/30 | (2006.01) |
| C23C 16/34 | (2006.01) |
| C23C 16/40 | (2006.01) |
| C23C 16/44 | (2006.01) |
| H01J 37/32 | (2006.01) |

(52) U.S. Cl.
CPC ........ *C23C 16/5096* (2013.01); *C23C 16/308* (2013.01); *C23C 16/345* (2013.01); *C23C 16/401* (2013.01); *C23C 16/4401* (2013.01); *H01J 37/32091* (2013.01); *H01J 37/32183* (2013.01)

(58) Field of Classification Search
CPC . C23C 16/308; C23C 16/401; C23C 16/4401; C23C 16/5096; H01J 37/32091; H01J 37/32183
USPC .......................................................... 427/508
See application file for complete search history.

(56) References Cited

U.S. PATENT DOCUMENTS

| | | | |
|---|---|---|---|
| 5,040,046 A | 8/1991 | Chhabra et al. | |
| 5,281,557 A * | 1/1994 | Yu .................................. | 438/696 |
| 5,394,061 A | 2/1995 | Fujii et al. | |
| 5,549,786 A | 8/1996 | Jones et al. | |
| 6,041,734 A * | 3/2000 | Raoux ................... | C23C 16/345 |
| | | | 118/723 E |
| 6,043,167 A | 3/2000 | Lee et al. | |
| 6,472,822 B1 | 10/2002 | Chen et al. | |
| 6,705,246 B2 | 3/2004 | Sharan et al. | |
| 8,513,889 B2 | 8/2013 | Zhang et al. | |
| 9,099,284 B2 | 8/2015 | Yang et al. | |
| 2005/0031796 A1 | 2/2005 | Wu et al. | |
| 2009/0136683 A1 * | 5/2009 | Fukasawa ............. | C23C 16/505 |
| | | | 427/569 |

* cited by examiner

*Primary Examiner* — Dah-Wei D Yuan
*Assistant Examiner* — Kristen A Dagenais
(74) *Attorney, Agent, or Firm* — Haynes and Boone, LLP (57) ABSTRACT

The present disclosure provides for methods of depositing a dielectric layer within a reaction chamber including a first electrode configured to support a substrate and a second electrode disposed above the first electrode and the substrate. A method includes flowing at least one reactant gas and at least one dilution gas into the reaction chamber, applying a first maximum low frequency radio frequency (LFRF) reflective power between the first and second electrodes to deposit a dielectric layer on the substrate, and applying a second maximum LFRF reflective power between the first and second electrodes during a termination operation, wherein the second maximum LFRF reflective power is less than the first maximum LFRF reflective power.

20 Claims, 5 Drawing Sheets

DIELECTRIC FILM DEFECT REDUCTION

BACKGROUND

During the manufacture of various types of monolithic integrated circuits (ICs), such as high density DRAMs having several thousand transistors fabricated in a single chip of silicon, there are many stages in the multi-level layer wafer processing sequence where it is desirable to provide layers of a selected dielectric insulating material such as silicon dioxide, $SiO_2$, or silicon nitride, $Si_3N_4$. As geometries shrink, particulate or particle defects in the dielectric layer can degrade performance of the device and lower yield.

Over the years, there have been many different types of thermal oxidation processes, vapor deposition processes and plasma deposition processes used to form oxides, nitrides, carbides, and other dielectric coatings in the manufacture of integrated circuits. In particular, plasma enhanced chemical vapor deposition (PECVD) systems have been used for dielectric deposition, but particle defects may be disadvantageously formed in the dielectric layer.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first", "second", "third", and so on, may be used herein to describe various process parameters or elements, such as RF power, tap setting, precursor gases, electrodes, and the like, these process parameters or elements should not be limited by these terms. These terms are only used to distinguish one process parameter or element from another process parameter or element. Thus, a first RF power, tap setting, or electrode discussed below could be termed a second RF power, tap setting, or electrode without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Figure 1:
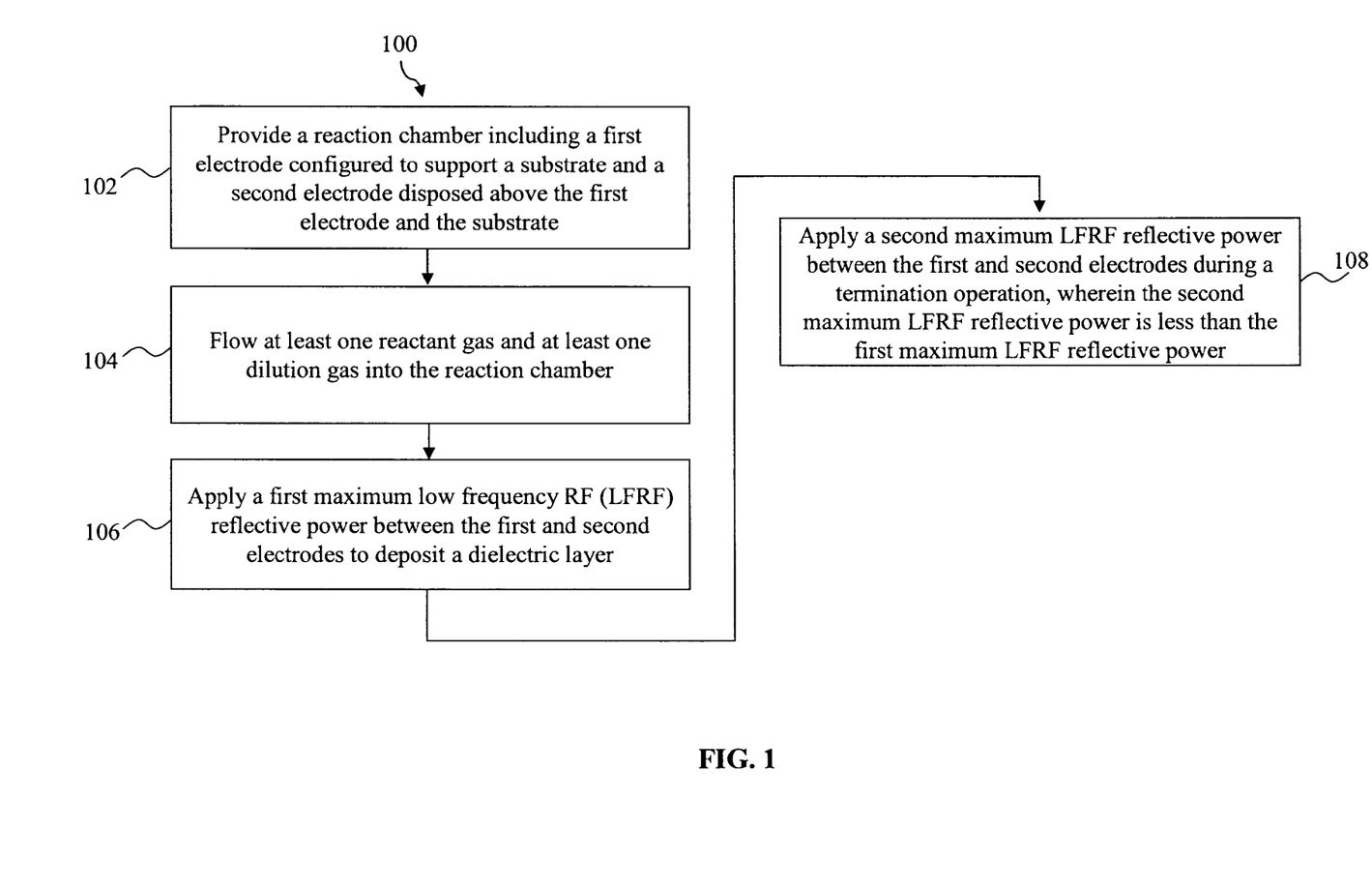
FIG. 1 is a flowchart illustrating a method for depositing a dielectric layer in accordance with embodiments of the present disclosure.

Referring now to FIG. 1, a flowchart is shown illustrating a method 100 for depositing a dielectric layer in accordance with embodiments of the present disclosure. Method 100 includes, at block 102, providing a reaction chamber including a first electrode configured to support a substrate and a second electrode disposed above the first electrode and the substrate. Method 100 further includes, at block 104, flowing at least one reactant gas and at least one dilution gas into the reaction chamber. Method 100 further includes, at block 106, applying a first maximum low frequency radio frequency (LFRF) reflective power between the first and second electrodes to deposit a dielectric layer on the substrate during a deposition operation. Method 100 further includes, at block 108, applying a second maximum LFRF reflective power between the first and second electrodes during a termination operation, wherein the second maximum LFRF reflective power is less than the first maximum LFRF reflective power.

In one embodiment of a plasma enhanced chemical vapor deposition process, a glow discharge (i.e., a plasma) is formed when RF power is applied between the two electrodes in the reaction chamber. Reactant gases contained within the reaction chamber produce chemically reactive species (e.g., atoms, ions, and radicals). These reactive species diffuse to and are absorbed on the surface of the substrate material. RF power may be applied to both the upper and lower electrodes. According to yet another aspect of the present disclosure, RF power may be applied to the upper electrode and the lower electrode may be held at ground potential. An impedance matching unit is adjusted to maximize the amount of RF power absorbed by the plasma. The setting of the impedance matching unit is called a tap setting in this document and corresponds to a maximum LFRF power applied between the upper and lower electrodes and absorbed by the plasma. An LFRF tap setting may include a tap number and a phase number, such as 2,2 (or 2/2) or 3,4 (or 3/4).

The various steps in method 100 described above may be performed by various techniques, means, apparatus, and/or systems. It should be noted that the operations of method 100 may be rearranged or otherwise modified within the scope of the various aspects of the present disclosure. It is further noted that additional processes may be provided before, during, and after the operations of method 100, and that some other processes may only be briefly described herein. Thus, other implementations are possible within the scope of the various aspects described herein.

According to one aspect of the present disclosure, the at least one reactant gas which is used in method 100 may be selected from the group consisting of silane, diethylsilane, ammonia, oxygen, nitrous oxide, a fluorocarbon, 4MS, carbon dioxide, and/or tetraethylorthosilicate (TEOS). According to another aspect of the present disclosure, the at least one dilution gas which is used in method 100 may be selected from the group consisting of nitrogen, argon, and/or helium.

According to yet another aspect of the present disclosure, the dielectric layer which is deposited in method 100 may be selected from the group consisting of silicon oxide, silicon nitride, and siliconoxynitride.

According to yet another aspect of the present disclosure, method 100 may further include changing a maximum LFRF reflective power applied between the first and second electrodes. The maximum LFRF reflective power may be changed by various processes, such as by stopping flow of the at least one reactant gas into the reaction chamber, stopping flow of the at least one dilution gas into the reaction chamber, changing a chamber pressure, applying a different power to the first electrode and/or the second electrode, changing a tap setting to an impedance matching unit coupled to the second electrode, and combinations thereof. In one example, a tap setting may be maintained between the deposition operation and the termination operation, and the LFRF reflective power may be passively changed by stopping flow of the at least one reactant gas into the reaction chamber, stopping flow of the at least one dilution gas into the reaction chamber, changing a chamber pressure, or combinations thereof. In another example, the LFRF reflective power may be actively changed by applying a different power to the first electrode and/or the second electrode, changing a tap setting to an impedance matching unit coupled to the second electrode, or combinations thereof. In other words, a first power or tap setting may be applied to the first electrode and/or the second electrode during the deposition operation and a second power or tap setting may be applied to the first electrode and/or the second electrode during the termination operation.

According to yet another aspect of the present disclosure, method 100 may further include applying a tap setting to an impedance matching unit coupled to the second electrode, wherein the tap setting is 3 and 4 corresponding to a first maximum LFRF reflective power of about 70 watts during a deposition operation and a second maximum LFRF reflective power of about 22 watts during a termination operation.

According to yet another aspect of the present disclosure, each tap setting of the method 100 may range between 1 and 7 corresponding to maximum LFRF reflective power between about 275 watts and about 22 watts. In one example, a tap/phase setting of 2/2 will provide a high LFRF reflective power of about 275 watts at a termination step, and a tap/phase setting of 3/4 will provide a low LFRF reflective power of about 22 watts at the termination step.

According to yet another aspect of the present disclosure, an optimized tap setting of 3,4 (or 3/4) may correspond to the first (main deposition step) maximum LFRF reflective power of about 70 watts and the second (termination step) maximum LFRF reflective power of about 22 watts.

According to yet another aspect of the present disclosure, method 100 may further include applying low frequency RF (LFRF) power to the first electrode, applying high frequency RF (HFRF) power to the second electrode, and forming a plasma between the first and second electrodes.

According to yet another aspect of the present disclosure, prior to applying a first tap setting, method 100 may further include providing a chamber pressure between about 2 Torr and about 3 Torr during a main deposition operation or a termination operation and providing a chamber temperature between about 300 degrees Celsius and about 400 degrees Celsius during a main deposition operation or a termination operation.

Advantageously, the termination operation of the present disclosure may react residual gas after the deposition operation with a lower maximum LFRF reflective power and provides for reduced particle defects on the deposited dielectric layer, thus improving device performance (e.g., an Rc parameter directly proportional to particle performance) and yield.

Figure 2:
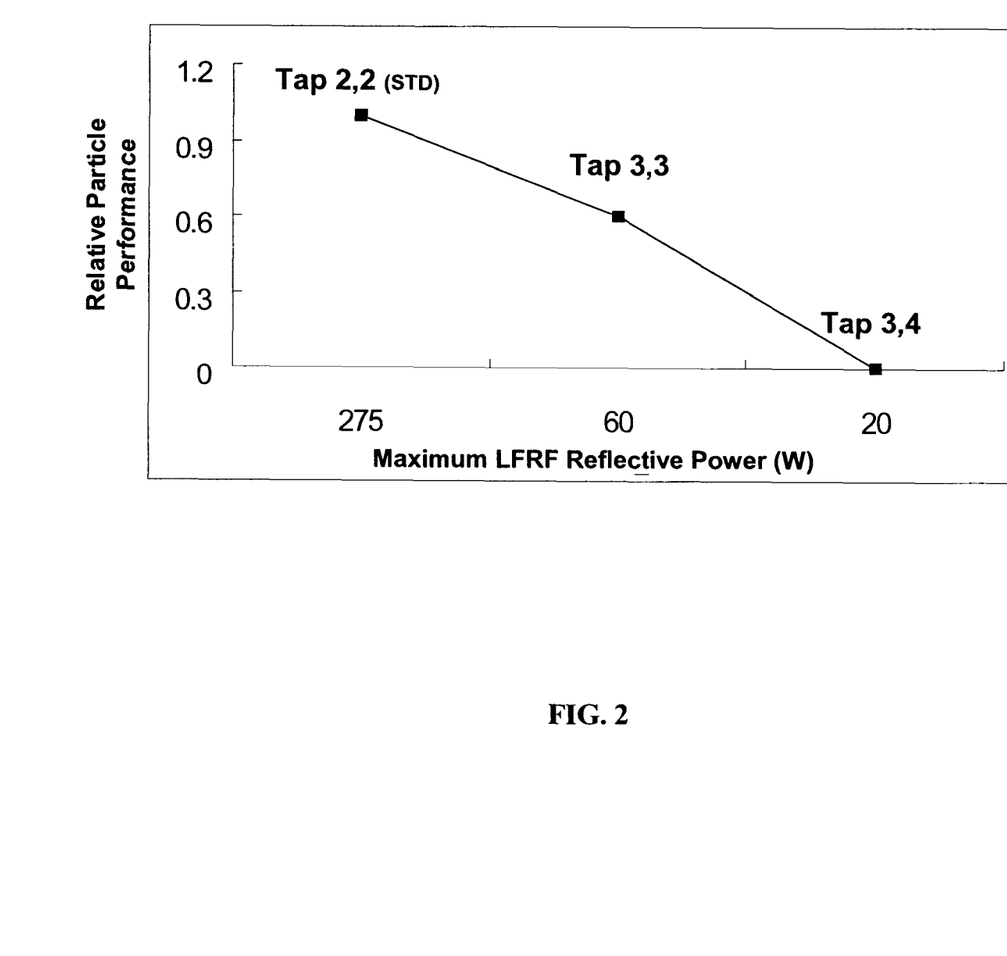
FIG. 2 is a graph of particle performance versus maximum low frequency RF reflective power applied between electrodes of a deposition chamber corresponding to tap settings of an impedance matching unit coupled to the electrodes of the deposition chamber in accordance with embodiments of the present disclosure.

Referring now to FIG. 2, a graph is shown of particle performance versus maximum LFRF reflective power applied between electrodes of a deposition chamber corresponding to tap settings of an impedance matching unit coupled to an electrode of the deposition chamber in accordance with embodiments of the present disclosure. As shown in FIG. 2, the impedance matching unit may be configured with a tap setting, for example 2 and 2 (i.e., tap 2,2 or 2/2), 3 and 3 (i.e., tap 3,3 or 3/3), or 3 and 4 (i.e., tap 3,4 or 3/4), with each tap setting corresponding to a maximum LFRF reflective power between the electrodes of the deposition chamber. In this embodiment, tap setting 2, 2 corresponds to a maximum LFRF reflective power of about 275 watts, tap setting 3, 3 corresponds to a maximum LFRF reflective power of about 60 watts, and tap setting 3, 4 corresponds to a maximum LFRF reflective power of about 22 watts. As further shown in FIG. 2, reduction of the maximum LFRF reflective power advantageously reduces particle formation, as shown by relative particle performance on the y-axis. Particle counts may be measured by optical tools. Other tap settings and corresponding maximum LFRF reflective power levels are within the scope of the present disclosure.

Figure 3:
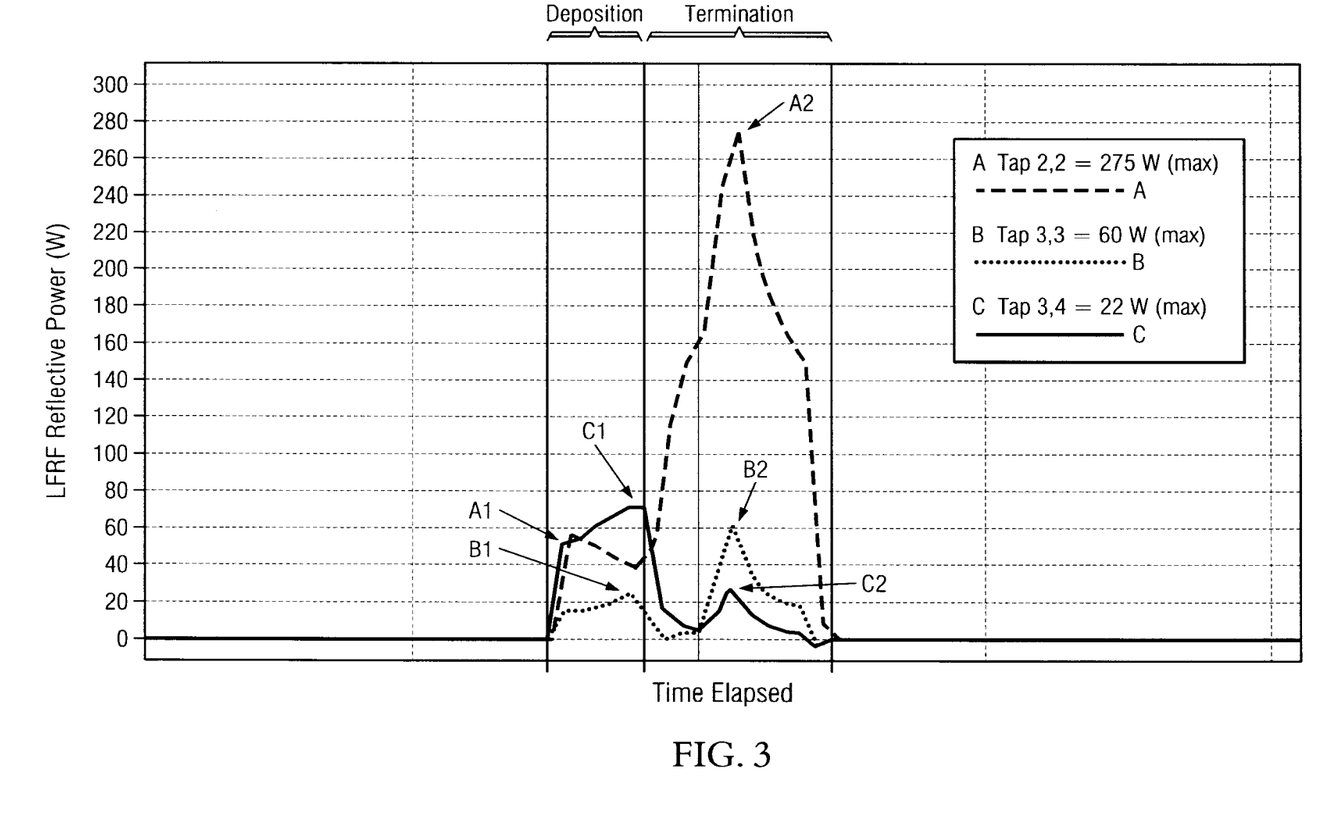
FIG. 3 is a graph of low frequency RF reflective power applied between electrodes of a deposition chamber versus time in accordance with embodiments of the present disclosure.

FIG. 3 shows a graph of LFRF reflective power applied between electrodes of the reaction chamber versus time in accordance with embodiments of the present disclosure. As shown in FIG. 3, a deposition operation occurs with the flowing of at least one reactant gas and a dilution gas into the deposition chamber and application of a first (main deposition) power level to the electrodes of the reaction chamber. A second maximum LFRF reflective power is applied between electrodes of the reaction chamber during a termination operation that subsequently occurs after the deposition operation.

The second maximum LFRF reflective power may be applied, in one example, by maintaining a tap setting between the deposition operation and the termination operation, and the LFRF reflective power may be passively changed by stopping flow of the at least one reactant gas into the reaction chamber, stopping flow of the at least one dilution gas into the reaction chamber, changing a chamber pressure, or combinations thereof. In another example, the LFRF reflective power may be actively changed by applying a different power to the first electrode and/or the second electrode, changing a tap setting to an impedance matching unit coupled to the second electrode, or combinations thereof. In other words, a first power or tap setting may be applied to the first electrode and/or the second electrode during the deposition operation and a second power or tap setting may be applied to the first electrode and/or the second electrode during the termination operation. In yet another example, during the deposition operation, a first chamber pressure, a first chamber temperature, and a first maximum applied RF power may be provided between the electrodes of the reaction chamber corresponding to a first tap setting of the impedance matching unit. During the termination operation, a second chamber pressure, a second chamber temperature, and a second maximum applied RF power may be provided corresponding to a second tap setting of the impedance matching unit.

FIG. 3 shows the following: a first (main deposition) maximum LFRF reflective power A1 (about 60 watts) during a deposition operation and a second (termination step) maximum LFRF reflective power A2 (about 275 watts) corresponding to a tap setting of 2, 2 during a termination operation; a first (main deposition) maximum LFRF reflective power B1 (about 25 watts) during a deposition operation and a second maximum LFRF reflective power B2 (about 60 watts) corresponding to a tap setting of 3, 3 during a termination operation; and a first maximum LFRF reflective power C1 (about 70 watts) during a deposition operation and a second maximum LFRF reflective power C2 (about 22 watts) corresponding to a tap setting of 3, 4 during a termination operation.

As further shown in FIG. 3 in conjunction with FIG. 2, as the maximum LFRF reflective power is reduced during the termination operation from the deposition operation, as is the C case from the first maximum LFRF reflective power C1 to the second maximum LFRF reflective power C2, particle formation is advantageously reduced, thereby improving yield and Rc performance. To the contrary, as the maximum LFRF reflective power is increased during the termination operation from the deposition operation, as in the A and B cases, from the first maximum applied RF power A1 and B1 to the second maximum applied RF power A2 and B2, respectively, particle formation is disadvantageously increased.

Figure 4:
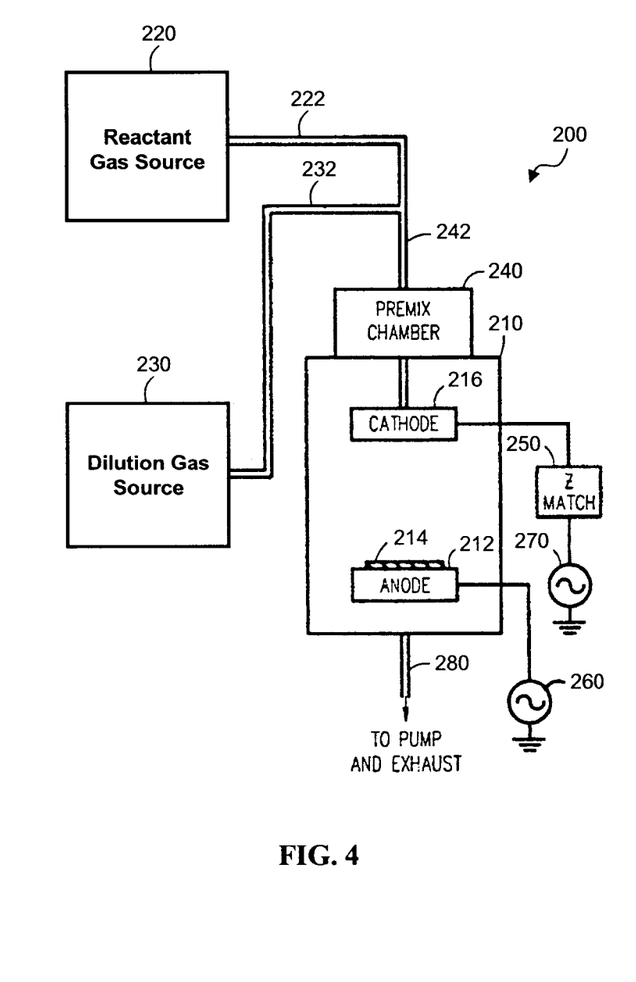
FIG. 4 illustrates a system for depositing a dielectric layer in accordance with embodiments of the present disclosure.

Referring now to FIG. 4, an applicable system 200 for depositing a dielectric layer in accordance with the methods described above is illustrated in accordance with embodiments of the present disclosure. System 200 includes a reaction chamber 210 (e.g., a CVD or PECVD chamber) including a first electrode 212 configured to support a substrate 214 and a second electrode 216 disposed above the first electrode 212 and the substrate 214. System 200 further includes at least one reactant gas source 220 and at least one dilution gas source 230, each operably coupled to reaction chamber 210 for flowing at least one reactant gas and at least one dilution gas, respectively, into the reaction chamber 210. System 200 further includes an impedance matching unit 250 coupled to the second electrode 216 to apply a radio frequency (RF) power between the first and second electrodes 212 and 216. A tap setting may be applied to impedance matching unit 250 to control the RF power applied between the first and second electrodes 212 and 216. During a deposition operation, a first tap setting may be applied to the impedance matching unit corresponding to a first maximum RF power, and during a termination operation, a second tap setting may be applied to the impedance matching unit corresponding to a second maximum RF power. A first RF power or voltage source 260 is coupled to first electrode 212, and a second RF power or voltage source 270 is coupled to impedance matching unit 250. A pump and exhaust feed line 280 is connected to the chamber 210 to provide pumping to establish partial vacuum conditions therein during PECVD operation and to provide a gas exhaust line used to flush out the system after a wafer processing operation has been completed. Chamber 210 may also include heating elements to control the temperature within the chamber as desired.

In one example, chamber 210 is a PECVD reaction chamber suitable to carry out the above described processes or method 100. An example of a PECVD reaction chamber is available from the Novellus Corporation of San Jose, California and sold under the trade name CONCEPT I.

In accordance with one aspect, first electrode 212 is opposed to second electrode 216 with a gap therebetween, and substrate 214 is disposed between the first and second electrodes 212 and 216. According to another aspect, first electrode 212 may function as an anode and be supplied with low frequency RF (LFRF) power from first RF power source 260, and second electrode 216 may function as a cathode and be supplied with high frequency RF (HFRF) power from second RF power source 270. In one embodiment, second electrode 216 may include a shower head electrode which is positioned operably adjacent the first electrode and configured to provide gaseous reactants into the chamber 210 from gas supply sources. In other embodiments, gaseous reactants may enter the chamber 210 through an inlet separate from the second electrode or through other means.

First electrode 212 is configured for supporting at least one substrate, e.g., in the form of a semiconductor wafer. The term "supporting" as used in this document and in connection with the first electrode is intended to mean holding or positioning one or more substrates in a desired orientation so that chemical vapor deposition can take place. Accordingly, substrate can be supported, held, or otherwise positioned in orientations other than the shown horizontal position. Furthermore, although a parallel plate PECVD chamber is illustrated, other RF power systems are applicable to perform the methods of the present disclosure, such as an inductive coil PECVD chamber as described in U.S. Pat. No. 6,705,246, the disclosure of which is incorporated by reference herein for all purposes. Furthermore, although chamber 210 is shown with two electrodes, it is to be understood that reaction chambers and methods can find use in systems which are not necessarily limited to only two electrodes. Furthermore, a single substrate is shown to be processed, but in other embodiments, a reaction chamber may be configured to process more than one substrate.

In accordance with one aspect, substrate 214 may include various semiconductor devices, and/or other suitable active and/or passive devices, at different stages of fabrication. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 214 may include a semiconductor substrate, and may be comprised of silicon, or alternatively may include silicon germanium, gallium arsenic, or other suitable semiconductor materials. The semiconductor substrate may include underlying layers, devices, junctions, and other features (not shown) formed during prior process steps or which may be formed during subsequent process steps.

In accordance with one aspect, reactant gas source 220 and dilution gas source 230 may each include reservoirs and are coupled to a premix chamber 240 via feed lines 222, 232, and common gas feed line 242. At least one reactant gas and at least one dilution gas from reactant gas source 220 and dilution gas source 230, respectively, may be provided to premix chamber 240 for premixing into a substantially uniform gas mixture prior to flow into reaction chamber 210. In one example, premix chamber 240 is disposed directly adjacent to chamber 210.

Reactant gas source 220 may include a conventional bubbler chamber, a heater coil, a shut-off valve, and/or an output port. In one example, reactant gas source 220 may provide various reactant gases depending on the desired dielectric layer to be deposited, such as silicon oxide, silicon nitride, or siliconoxynitride. In one example, reactant gases may include silane, diethylsilane, ammonia, oxygen, nitrous oxide, a fluorocarbon, and/or tetraethylorthosilicate (TEOS). Although a single reactant gas source 220 is illustrated, system 200 may include a plurality of reactant gas sources as desired and coupled in a similar manner as reactant gas source 220 to reaction chamber 210.

Dilution gas source 230 may include a heater coil, a shut-off valve, and/or an output port and may provide various dilution gases, including but not limited to nitrogen, helium, and/or argon.

Although not necessarily shown, reactant gas and dilution gas may be flowed from reactant gas source 220 and dilution gas source 230 to deposition chamber 210 through various apparatus such as flow lines, pressure regulators, valves, mass flow controllers or other flow controllers, manifolds, and/or regulators. In one example, mass flow controllers may be of the electronic type wherein a variable set point may be established to provide a constant chosen gas flow rate and to automatically compensate for external parameter variations, such as variations in temperature and variations in pressures in the various flow lines of the system. The manifolds may be used to provide premixing of the various combined gases.

Both of the feed lines 222 and 232 may be provided with shut-off valves which may be used at any time to both start up and shut down the system operation. Shut-off valves may also be included in reactant gas source 220 and/or dilution gas source 230.

System 200 may further include a purge gas source that is operably coupled to chamber 210 for flowing a purge gas into chamber 210 prior to deposition start up and may also be used to flush the system. The purge gas source may provide various purge gases, including but not limited to nitrogen or argon.

In one example operation, substrate 214 may be a silicon wafer disposed on an upper surface of the anode electrode, and the silicon wafer may have been processed to various stages toward completion of the ultimate or complete integrated circuit being fabricated. For example, the wafer may have been processed to the stage where conductive interconnect strips have been disposed and interconnected on the wafer surface and are now ready to receive a protective dielectric coating of either silicon oxide or silicon nitride, or both, thereon.

In one embodiment, the power ratios received from the low frequency RF source 260 and the high frequency RF source 270 may be varied in order to vary the stress of the deposited dielectric layer from a highly tensile state to a highly compressive state. In one example, the high frequency RF source 270 may be operated at 13.56 megahertz and the low frequency RF source 260 may be operated between 10-400 kilohertz. As an example, the total RF power applied to the PECVD chamber may range between about 900 watts and about 1300 watts, with between 400-500 watts being applied from the high frequency RF source 270 and between 800-1000 watts being applied from the low frequency RF source 260. Although two RF power sources 260 and 270 are illustrated, a single RF power source may be used to apply RF power to each electrode 212 and 216 in another embodiment. An example of an RF power splitter and a single RF power source is illustrated and described in U.S. Pat. No. 6,705,246, the disclosure of which has been previously incorporated by reference herein.

The high frequency RF source 270 is connected as shown through an impedance matching unit 250 for impedance matching purposes, which may substantially prevent high frequency RF power from being reflected back into the RF source 270 and to maximize the amount of RF power absorbed by the plasma. Impedance matching unit 250 includes various capacitive and inductive components which are configured for impedance matching and for maximizing power applied between the first and second electrodes 212, 216 of reaction chamber 210.

Tap settings may be applied to the impedance matching unit coupled to the second electrode to apply a maximum radio frequency (RF) power between the first and second electrodes. In one embodiment, two tap settings may be applied between 1 and 7, with a tap setting of 2 and 2 (or 2, 2) corresponding to a maximum LFRF reflective power of about 275 watts, a tap setting of 3 and 3 (or 3, 3) corresponding to a maximum LFRF reflective power of about 60 watts, and a tap setting of 3 and 4 (or 3, 4) corresponding to a maximum LFRF reflective power of about 22 watts. Other tap settings corresponding to other applied maximum RF power is within the scope of the present disclosure and may depend on various process parameters.

RF sources 260 and 270 are configured to provide RF power to the electrodes which is effective to both develop a plasma processing environment within the processing chamber and to provide a desired bias relative to the substrate. For example, a power differential between the electrodes may facilitate acceleration of ions or ionic species toward the subject substrate which may enhance conformal coverage and/or provide greater uniformity in film or layer composition.

As noted above, during a deposition operation, a first tap setting may be applied to the impedance matching unit 250 corresponding to a first maximum RF power to provide a plasma processing environment and to deposit a dielectric layer on the substrate. During a termination operation, the flow of reactant gas may be ceased and a second tap setting may be applied to the impedance matching unit 250 corresponding to a second maximum RF power, wherein the second maximum RF power is less than the first maximum RF power, in order to substantially reduce particle formation.

Figure 5:
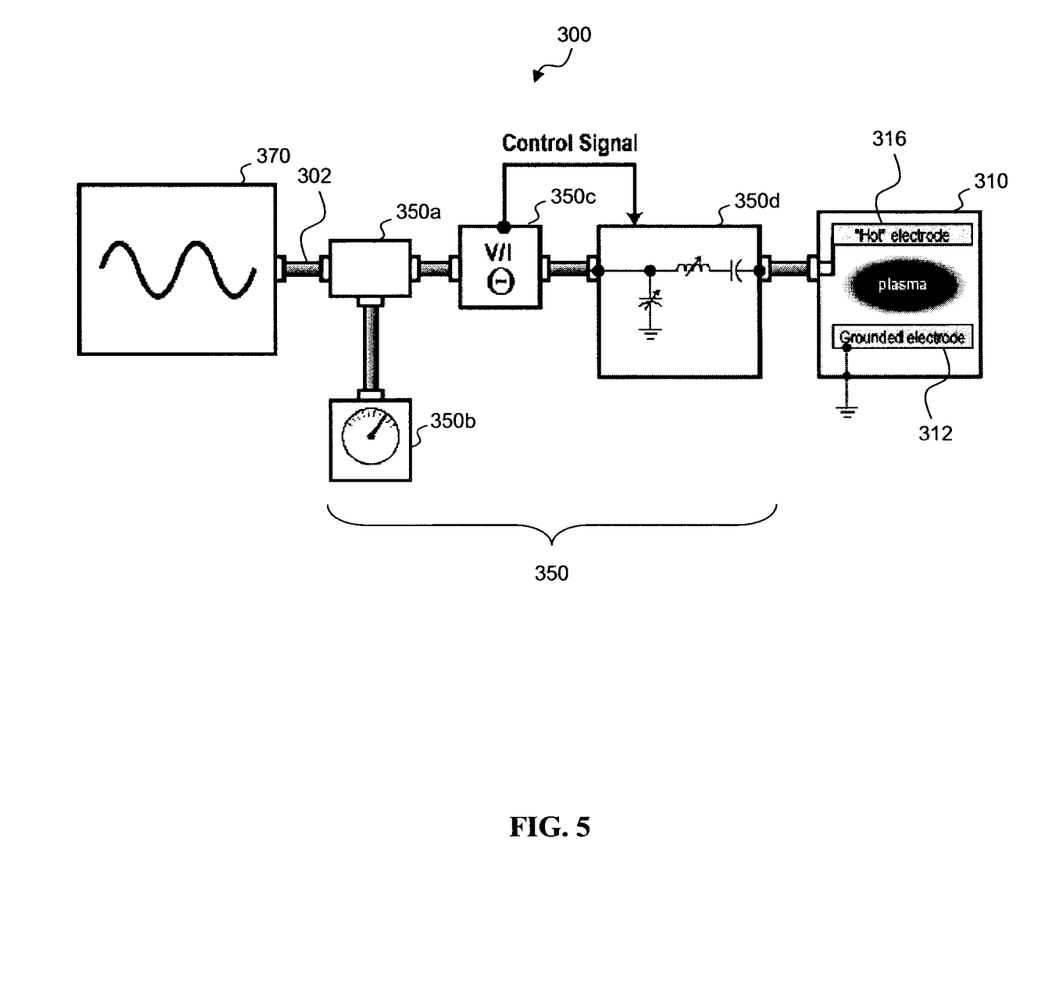
FIG. 5 illustrates another system for depositing a dielectric layer in accordance with embodiments of the present disclosure.

Referring now to FIG. 5, a dielectric deposition system 300 is illustrated including a more detailed view of an impedance matching unit 350 in accordance with embodiments of the present disclosure. In one example, an impedance matching unit 350 is mounted on or near a reaction chamber 310 and is connected to a remotely located RF source 370 by way of a transmission line 302, such as a coaxial cable.

Reaction chamber 310 includes a first electrode 312 and a second electrode 316, with similar descriptions above for first and second electrodes 212 and 216 being applicable in this embodiment. Furthermore, in this embodiment, first electrode 312 supporting a substrate (e.g., a silicon wafer) is grounded but may also be coupled to an RF source or generator.

In accordance with one aspect, impedance matching unit 350 includes a power coupler 350a coupled to RF source 370, a power meter 350b coupled to power coupler 350a, a controller 350c coupled to power coupler 350a, and an impedance matching apparatus 350d coupled between controller 350c and second electrode 316 of reaction chamber 310. An RF power signal passes from RF source 370 to power coupler 350a, wherein the signal is tapped off so that power can be measured and displayed to the equipment operator via power meter 350b. Controller 350c may be used to apply tap settings (e.g., two tap dials each able to be set from 1 to 7) and to provide a measure of power level (magnitude and phase) to generate control signals used to control the variable components in the impedance matching apparatus 350d for power adjustment between the electrodes within chamber 310.

As noted above, impedance mismatch is a condition that can result in power losses, poor or inconsistent processing results, and/or potential equipment damage. RF sources and generators and most radio transmitters and other RF equipment typically use a constant (e.g., a 50 ohm) output impedance. Plasma loads are complex impedances, meaning that they have a reactive (usually capacitive) component as well as a resistive component, and this impedance may change constantly during a process. Thus, an impedance mismatch may exist between the RF source or generator 370 and the load of the reaction chamber electrodes. Impedance matching may use electronic components or circuits (e.g., capacitive and/or inductive components of impedance matching apparatus 350d) to make the changing complex load of the plasma appear to be a constant resistance to the RF source 370. Impedance matching may thus provide constant maximum power delivery to the load between the electrodes of the reaction chamber 310. Automatic control circuits may work with the impedance matching unit to ensure a constant power delivery in one example.

The following Example 1 provides processing parameters for depositing a silicon dioxide layer in accordance with an embodiment of the present disclosure. Example 2 below provides processing parameters for depositing a silicon nitride layer in accordance with an embodiment of the present disclosure.

EXAMPLE 1

Silane reactant gas, $CO_2$ reactant gas, and helium dilution gas were provided at gas flow rates of 450 standard cubic centimeters per minute (sccm), 10000 sccm, and 18000 sccm, respectively, into chamber 210. The PECVD chamber was pumped down to a pressure of about 3.5 Torr and heated to about 400 degrees Celsius. A first tap setting of 3/4 was applied to impedance matching unit 250 to apply a first maximum radio frequency (RF) power between the first and second electrodes. The high frequency RF power in the PECVD chamber was set to 450 watts and the low frequency RF power therein was set to 300 watts. During the deposition operation, approximately 200 angstroms of SION (NFARL) was deposited on a silicon substrate disposed on the first electrode 212 in a time of about 12 seconds.

After deposition was complete, a termination operation followed for a time of about 5 seconds in which the flow of reactant gases was stopped but the flow of dilution gas continued, and a second tap setting of 3/4 was applied to impedance matching unit 250 to apply a second maximum radio frequency (RF) power between the first and second electrodes to react residual gases and substantially reduce particle formation. The high frequency RF power in the PECVD chamber was set to 450 watts and the low frequency RF power therein was set to 300 watts. The second maximum LFRF reflective power was less than the first maximum LFRF reflective power and the termination operation pressure was less than the deposition operation pressure.

EXAMPLE 2

Silane reactant gas (4MS), ammonia reactant gas, and helium dilution gas were provided at gas flow rates of 1000 standard cubic centimeters per minute (sccm), 950 sccm, and 4500 sccm, respectively, into chamber 210. The PECVD chamber was pumped down to a pressure of about 2.5 Torr and heated to about 350 degrees Celsius. A first tap setting of 3/4 was applied to impedance matching unit 250 to apply a first maximum radio frequency (RF) power between the first and second electrodes. The high frequency RF power in the PECVD chamber was set to 500 watts and the low frequency RF power therein was set to 900 watts. During the deposition operation, approximately 100 angstroms of silicon nitride was deposited on a silicon substrate disposed on the first electrode 212 in a time of about 8 seconds.

After deposition was complete, a termination operation followed for a time of about 3 seconds in which the flow of reactant gases was stopped but the flow of dilution gas continued, and a second tap setting of 3/4 was applied to impedance matching unit 250 to apply a second maximum radio frequency (RF) power between the first and second electrodes to react residual gases and substantially reduce particle formation. The high frequency RF power in the PECVD chamber was set to 500 watts and the low frequency RF power therein was set to 900 watts. The second maximum RF power was less than the first maximum RF power and the termination operation pressure was less than the deposition operation pressure.

It is also within the scope of the present disclosure and the claims appended hereto to deposit materials other than those specifically described above, such as epitaxial silicon, silicon carbide and silicon oxy-nitride, phosphorus silicate glass (PSG), and borophosphorus silicate glass (BSG) by modifying the reactant gas sources in a controlled manner by those skilled in the art. In addition, for at least some of the above described processes, it is possible to operate the reactant gas source and dilution gas source at room temperature and thereby eliminate the heating element as previously described. That is, the various vapor and gas delivery lines described above and located between the gas sources and the reaction chamber 210 may be relatively short, so that it is possible to obtain an adequate vapor flow rate in the delivery lines of this system at room temperature.

It is further possible to operate the reaction chamber 210 in all of the above examples within a wide temperature range of between about 300 degrees Celsius and about 500 degrees Celsius as a matter of choice and depending upon whether higher temperatures would unduly degrade a semiconductor structure being processed. Accordingly, these and other process and materials variations are clearly within the scope of the following appended claims.

These silicon dioxide and silicon nitride layers are useful in a wide range of applications in the manufacture of many different types of integrated circuits. For example, these applications include the use of these materials as protective layers for integrated circuit conductors, protective and passivating layers for semiconductor surfaces and PN junctions formed thereon, spacers for use on word lines and bit or digit lines of random access memories, diffusion masks for determining the P or N-type conductivity profiles in semiconductor substrates, etch stop layers, and anti-reflective layers for photolithography. Furthermore, it has also been discovered that the termination process according to the present disclosure is capable of minimizing precipitates which have heretofore occurred during deposition of such dielectric layers. Moreover, the present disclosure provides for deposition of dielectric layers with increased Rc performance and increased yield.

Thus, the present disclosure provides for various embodiments. According to one embodiment, a method for depositing a dielectric layer within a reaction chamber including a first electrode configured to support a substrate and a second electrode disposed above the first electrode and the substrate is provided. The method includes flowing at least one reactant gas and at least one dilution gas into the reaction chamber, applying a first maximum low frequency radio frequency (LFRF) reflective power between the first and second electrodes to deposit a dielectric layer on the substrate, and applying a second maximum LFRF reflective power between the first and second electrodes during a termination operation, wherein the second maximum LFRF reflective power is less than the first maximum LFRF reflective power.

In another embodiment, a method for depositing a dielectric layer includes flowing at least one reactant gas and at least one dilution gas into the reaction chamber; applying a tap setting to an impedance matching unit coupled to the second electrode; applying a first maximum low frequency radio frequency (LFRF) reflective power between the first and second electrodes to form a plasma between the first and second electrodes and to deposit a dielectric layer on the substrate during a deposition operation; changing a maximum LFRF reflective power applied between the first and second electrodes; and applying a second maximum LFRF reflective power between the first and second electrodes during a termination operation, wherein the second maximum LFRF reflective power is less than the first maximum LFRF reflective power.

In yet another embodiment, a method for depositing a dielectric layer includes flowing at least one reactant gas and at least one dilution gas into the reaction chamber; providing a chamber pressure between about 2 Torr and about 3 Torr; providing a chamber temperature between about 300 degrees Celsius and about 400 degrees Celsius; applying a tap setting of 3 and 4 to an impedance matching unit coupled to the second electrode; applying a first maximum low frequency radio frequency (LFRF) reflective power between the first and second electrodes to form a plasma between the first and second electrodes and to deposit a dielectric layer on the substrate during a deposition operation, wherein the maximum LFRF reflective power is about 70 watts; changing a maximum LFRF reflective power applied between the first and second electrodes; and applying a second maximum LFRF reflective power between the first and second electrodes during a termination operation, wherein the second maximum LFRF reflective power is about 22 watts.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of depositing a dielectric layer within a reaction chamber including a first electrode configured to support a substrate and a second electrode disposed above the first electrode and the substrate, the method comprising:
  performing a deposition operation followed by a termination operation, wherein the deposition operation includes:
  flowing at least one reactant gas and at least one dilution gas into the reaction chamber;
  applying a first radio frequency (RF) power to the first electrode and a second RF power to the second electrode; and providing a first maximum low frequency radio frequency (LFRF) reflective power during the deposition operation depositing a dielectric layer on the substrate;

after the depositing the dielectric layer on the substrate starting the termination operation including stopping a flow of the at least one reactant gas;

changing an impedance provided by an impedance matching unit coupled to the second electrode during the termination operation; and wherein the changing the impedance provides a second maximum LFRF reflective power during the termination operation wherein the second maximum LFRF reflective power less than the first maximum LFRF reflective power.

2. The method of claim 1, wherein the at least one reactant gas is selected from the group consisting of silane, diethylsilane, ammonia, oxygen, nitrous oxide, a fluorocarbon, 4MS, carbon dioxide, and/or tetraethylorthosilicate (TEOS).

3. The method of claim 1, wherein the at least one dilution gas is selected from the group consisting of argon, nitrogen, and helium.

4. The method of claim 1, wherein the dielectric layer is selected from the group consisting of silicon oxide, silicon nitride, and siliconoxynitride.

5. The method of claim 1, wherein the providing the second maximum LFRF reflective power during the termination operation further comprises:

performing a process selected from the group consisting of stopping flow of the at least one reactant gas into the reaction chamber, and applying a different power to the reaction chamber.

6. The method of claim 1, wherein:

the providing the first maximum low frequency radio frequency (LFRF) reflective power includes applying a first tap setting to the impedance matching unit coupled to the second electrode; and changing the impedance provided by the impedance matching unit includes applying a second tap setting to the impedance matching unit coupled to the second electrode, the second tap setting different than the first tap setting.

7. The method of claim 1, wherein the applying the first RF power includes applying low frequency RF (LFRF) power to the first electrode;

the applying the second RF power includes applying high frequency RF (HFRF) power to the second electrode; and forming a plasma between the first and second electrodes.

8. A method of depositing a dielectric layer within a reaction chamber including a first electrode configured to support a substrate and a second electrode disposed above the first electrode and the substrate, the method comprising:

flowing at least one reactant gas and at least one dilution gas into the reaction chamber;

applying a first low frequency radio frequency (LFRF) power to the first electrode of the reaction chamber to form a plasma between the first and second electrodes and to deposit a dielectric layer on the substrate during a deposition operation, wherein there is a first maximum LFRF reflective power during the deposition operation;

after the depositing the dielectric layer on the substrate, performing a termination operation;

applying the first LFRF power to the first electrode during the termination operation;

providing a second maximum LFRF reflective power during the termination operation while applying the first LFRF power, wherein the second maximum LFRF reflective power is less than the first maximum LFRF reflective power, wherein the providing the second maximum LFRF reflective power includes changing at least one of an impedance provided by an impedance matching unit coupled to one of the first and second electrodes, stopping a flow of the at least one dilution gas, and changing a pressure in the reaction chamber.

9. The method of claim 8, wherein the at least one reactant gas is selected from the group consisting of silane, diethylsilane, ammonia, oxygen, nitrous oxide, a fluorocarbon, 4MS, carbon dioxide, and/or tetraethylorthosilicate (TEOS).

10. The method of claim 8, wherein the at least one dilution gas is selected from the group consisting of argon, nitrogen, and helium.

11. The method of claim 8, wherein the dielectric layer is selected from the group consisting of silicon oxide, silicon nitride, and siliconoxynitride.

12. The method of claim 8, wherein the providing the second maximum LFRF reflective power includes:

changing a tap setting to the impedance matching unit coupled to the second electrode.

13. The method of claim 12, wherein the tap setting is provided during the depositing the dielectric layer to provide the first maximum LFRF reflective power of about 70 watts and wherein the tap setting provides the second maximum LFRF reflective power of about 22 watts during the termination operation.

14. The method of claim 8, further comprising:

applying a high frequency RF (HFRF) power to the second electrode of the reaction chamber during the depositing and the termination operation.

15. The method of claim 8, further comprising:

during the depositing the dielectric layer on the substrate, providing the chamber pressure between about 2 Torr and about 3 Torr; and during the depositing the dielectric layer on the substrate, providing a chamber temperature between about 300 degrees Celsius and about 400 degrees Celsius.

16. A method of depositing a dielectric layer within a reaction chamber including a first electrode configured to support a substrate and a second electrode disposed above the first electrode and the substrate, the method comprising:

flowing at least one reactant gas and at least one dilution gas into the reaction chamber;

providing a first chamber pressure;

applying a first tap setting to an impedance matching unit coupled to the second electrode;

applying a low frequency radio frequency (LFRF) power to the first electrode of the reaction chamber to form a plasma between the first and second electrodes and to deposit a dielectric layer on the substrate during a deposition operation;

wherein during the deposition operation a first maximum LFRF reflective power is provided;

after the depositing the dielectric layer on the substrate, providing a second chamber pressure during a termination operation;

continuing applying the LFRF power to the first electrode while applying a second tap setting to the impedance matching unit coupled to the second electrode during the termination operation, the second tap setting different than the first tap setting; and wherein the second tap setting provides a second maximum LFRF reflective power during the termination operation, wherein the second maximum LFRF reflective power is less than the first maximum LFRF reflective power during the termination operation.

17. The method of claim 1, further comprising:
during the termination operation and providing the second maximum reflective LFRF power, applying the first power to the first electrode and the second power to the second electrode.

18. The method of claim 1, wherein the second maximum reflective LFRF power is approximately 20 Watts.

19. The method of claim 16, further comprising applying a power of a first wattage to the second electrode of the reaction chamber to form the plasma during the depositing, and continuing to apply the power of the first wattage to the second electrode during the termination operation.

20. The method of claim 8, further comprising: applying a high frequency radio frequency (HFRF) power to the second electrode of the reaction chamber during the depositing and the termination operation, wherein a same wattage of HFRF power is applied during the depositing and the termination operation.

* * * * *